United States Patent

Wuyts et al.

[11] Patent Number: 5,940,967
[45] Date of Patent: Aug. 24, 1999

[54] METHOD FOR INSERTING AN ELECTRICAL CONTACT PIN WITH A COMPLIANT ATTACHMENT ZONE INTO A HOLE IN PRINTED CIRCUIT BOARD WITH CONTROLLED INSERTION LENGTH AFTER A SIGNIFICANT RISE IN INSERTION FORCE IS DETECTED

[75] Inventors: Robert A. H. J. Wuyts, Antwerp; Yves S. A. Loosen, Ruisbroek, both of Belgium

[73] Assignee: Framatome Connectors International, Courbevoie, France

[21] Appl. No.: 08/955,666

[22] Filed: Oct. 22, 1997

[30] Foreign Application Priority Data

Oct. 23, 1996 [BE] Belgium ................................. 9600895

[51] Int. Cl.[6] .............................. H01R 9/00; B23P 19/00
[52] U.S. Cl. ................................. 29/845; 29/842; 439/82
[58] Field of Search ......................... 439/82, 751; 29/842, 29/845

[56] References Cited

U.S. PATENT DOCUMENTS

| | | | |
|---|---|---|---|
| 4,383,361 | 5/1983 | Kautz | 29/845 X |
| 4,612,700 | 9/1986 | Loomis et al. | 29/564.6 |
| 4,763,400 | 8/1988 | Deckers | 29/845 |
| 5,092,029 | 3/1992 | Fisher et al. | 29/845 X |
| 5,400,502 | 3/1995 | Ota et al. | 29/845 |
| 5,411,418 | 5/1995 | Welsh et al. | 29/845 X |
| 5,499,443 | 3/1996 | Ota et al. | 29/845 X |
| 5,737,829 | 4/1998 | Wolfe et al. | 29/845 X |
| 5,740,607 | 4/1998 | Zell et al. | 29/845 |

FOREIGN PATENT DOCUMENTS

| 0120588 A2 | 10/1984 | European Pat. Off. . |
| 0730326 A2 | 9/1996 | European Pat. Off. . |

OTHER PUBLICATIONS

Patent Abstracts of Japan, vol. 017, No. 615 (E–1459), Nov. 12, 1993 & JP 05 191097 A, Sanyo Electr Co., Ltd., Jul. 30, 1993.

Electronic Packaging and Production, Mar. 28, 1988, No. 3, pp. 66–69, XP000111172, O'Black, R " "Poka–Yoke" Means Mistake–Proof Production".

*Primary Examiner*—Lee W. Young
*Assistant Examiner*—Rick Kiltae Chang
*Attorney, Agent, or Firm*—Perman & Green, LLP

[57] ABSTRACT

Method for inserting an electrical contact pin with a compliant attachment zone into a hole in a printed circuit board. The method consists of before commencing the insertion cycle, the data relating to the dimensions of the contact pins in relation to the connector housing, the geometry of the compliant attachment zone, the desired insertion depth as well as the diameter of the holes in the circuit board is stipulated in the control means;

the insertion movement of the press starts with the insertion of the first (non-compliant) section of the pin, which should not induce any resistance force, but merely provides guidance for the pin; during said insertion movement, the insertion force and insertion depth are continually controlled;

at the moment of perception when the insertion force begins to increase significantly, i.e. when the first contact is made between the underneath of one of the compliant attachment zones (FCP) of the contact pins and the upper edge of the corresponding hole in the printed circuit board, a distance remaining to be inserted (X) is defined and stored in the control means;

the insertion movement is continued, taking into account the distance remaining to be inserted (X), in order to insert the contact pin to the correct depth in the printed circuit board, so that the connector housing just comes into contact with the circuit board or is positioned a small distance away from the circuit board.

2 Claims, 1 Drawing Sheet

METHOD FOR INSERTING AN ELECTRICAL CONTACT PIN WITH A COMPLIANT ATTACHMENT ZONE INTO A HOLE IN PRINTED CIRCUIT BOARD WITH CONTROLLED INSERTION LENGTH AFTER A SIGNIFICANT RISE IN INSERTION FORCE IS DETECTED

BACKGROUND OF THE INVENTION

The invention concerns a method for inserting contact pins with an compliant attachment zone, which are generally mounted in the housing of a connector (so-called "press-fit" connector), in corresponding holes of a printed circuit board or of another part.

For inserting the connectors, equipped with compliant contact pins into a printed circuit board, use is generally made of a press, which must insert the contact pins. of the connector into the corresponding holes of the board, and must deform the compliant attachment zone of each pin such that the complete connector is secured to the board.

As is generally known, a contact pin with an compliant attachment zone consists of an elongated rod, usually with a square cross-section, where a part of the rod is cut in half longitudinally in order to form two legs next to each other, each of which is bent outwards in order to obtain an compliant attachment zone.

When inserting a pin into a hole in the board, the first non-compliant section of the pin is first inserted into the board, thus obtaining initial guidance for the pin, whereby virtually no resistance force will be induced.

When the compliant zone reaches the upper edge of the hole, the insertion force increases, and the legs which are bent outwards will move towards each other in an elastic manner in order to generate a retention force by the pin against the wall of the hole.

The insertion force that is required to perform this operation can be substantial, especially when the connector is equipped with a large number of contact pins which must be secured in their corresponding holes.

The major problem that is immediately apparent is stopping the downward movement of the press in time, in order to prevent any damage or deformation to the circuit board due to contact between the connector housing and the board.

Existing presses are usually provided with computer-controlled unit, and are equipped with a force measuring device that is incorporated in the head of the press and can measure and control the progress of the force/insertion curve.

For example, the press can be stopped when the developed force reaches a certain maximum value.

In practice, this can however lead to serious problems, since for presses of this capacity the inertia of the downward movement should not be underestimated, and can result in the housing of the connector being pressed against the board with excessive force, possibly resulting in damage to the board.

It is known for the insertion force of the press to increase by 1000 Newton per 0.01 mm at the end of the insertion cycle, when the housing of the connector comes into contact with the board.

It is also not possible to pre-set the correct maximum insertion depth since the thickness tolerance of the printed circuit board (PCB), which is normally 3.2 mm, is difficult to control. Thickness deviations of 10 to 12% are usual for the boards. In practice, these thickness deviations vary by several tenths of a millimeter since in this case, they relate to a laminated composite board.

In order to prevent over-pressing, it is consequently desirable to stop the press in good time in order to prevent the pressing movement from continuing after the housing of the connector has come into contact with the board.

In many applications, it is also desirable to leave an air gap between the connector housing and the surface of the circuit board.

SUMMARY OF THE INVENTION

The purpose of the invention is to propose a method which enables the movement of the press to be adjusted so that any overloading of the board and/or the connector housing is eliminated and whereby, if necessary, the connector housing is automatically positioned at the correct distance from the board.

For this purposes, the method according to the invention is characterised in that all parameters of the components, namely at least one contact pin and one compliant attachment zone, at least one corresponding hole of the printed circuit board and the desired insertion depth are defined beforehand in the data for the control means of the insertion and press device, and whereby the insertion movement of the press starts with the insertion of the first (non-compliant) section of the pin, which normally does not induce any resistance force, but merely provides guidance for the pin; during said insertion (movement of the press), the insertion force and insertion depth are continually measured and controlled.

at the moment of observing when the insertion force begins to increase significantly, i.e. when the first contact is made between the underneath of the compliant attachment zone of one of the contact pins and the upper edge of the corresponding hole in the printed circuit board, a distance remaining to be inserted is defined and stored in the control means;

the insertion movement is continued, taking into account the distance remaining to be inserted, in order to insert the contact pin to the correct depth in the board.

The press device consists of a top beam, in the form of a gantry on which the insertion head is mounted, and a table which is essentially manufactured from a material that has high stiffness characteristics, such as granite or concrete agglomerate in order to minimise the deformation of the top beam and the table.

The dimensions of the hole or holes in the printed circuit board can be detected by a camera of the normal CCD array type, as previously described in the Belgian patent application No. 9500914 in the name of the applicant.

Other characteristics of the invention are explained on the basis of the following description of an embodiment, with reference to the annexed drawings.

DETAILED DESCRIPTION OF THE DRAWINGS

DESCRIPTION OF THE PREFERRED EMBODIMENTS

Figure 1:
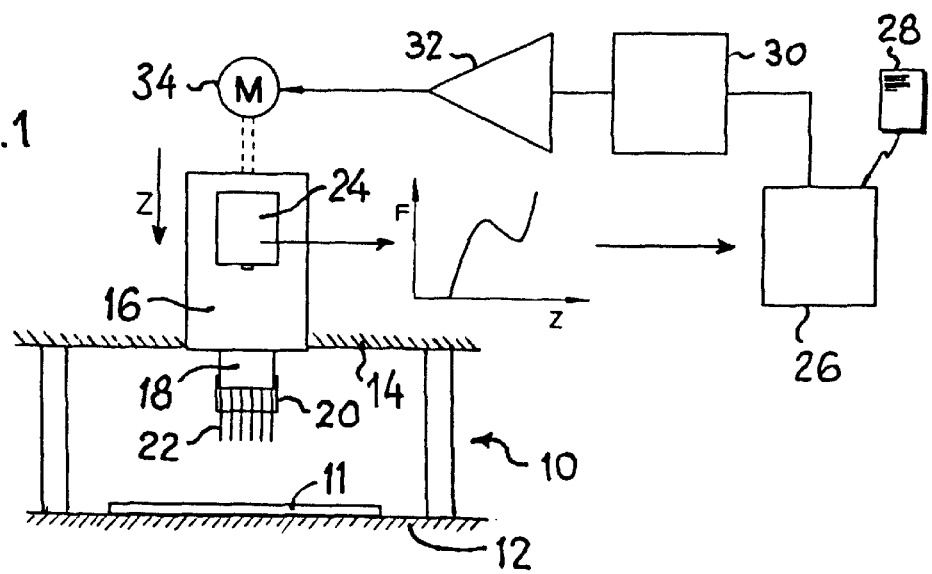
FIG. 1 is a schematic representation of the arrangement of the main parts that are required for performing the method according to the invention.

FIG. 1 illustrates a press device 10 that is equipped with a table 12 and a top beam in the form of a gantry 14. A printed circuit board 11 is attached to the table 12.

The gantry 14 is equipped with an insertion head 16 with a press/gripping device 18 that retains a connector housing 20 with contact pins 22.

For carrying out the method as per the invention, the insertion head 16 is equipped with a device 24 for measuring the force exerted during the insertion of the contact pins. The displacement distance of the insertion head 16 can be measured and determined using a known means, e.g. an absolute pulse generator.

The press device 10 is equipped with a closed-circuit control system whereby the data that is recorded by the force/measurement device and the insertion depth of the insertion head 16 are transmitted to the computer unit 26 for operating the drive motor.

This computer unit 26 also receives all data relating to the geometry of each contact and type of connector housing via a data bank 28, and transmits control signals via a "servo-control" unit 30 and an amplifier 32 to the drive motor 34 of the press device 10.

The drive motor 34 is preferably an electromotor of the high dynamic type with servo control, since a hydraulically-driven or pneumatically-driven press device would respond much too slowly to the control commands, would cause overloading, and could possibly result in damage to the printed circuit board and/or the connector housing.

Figure 2:
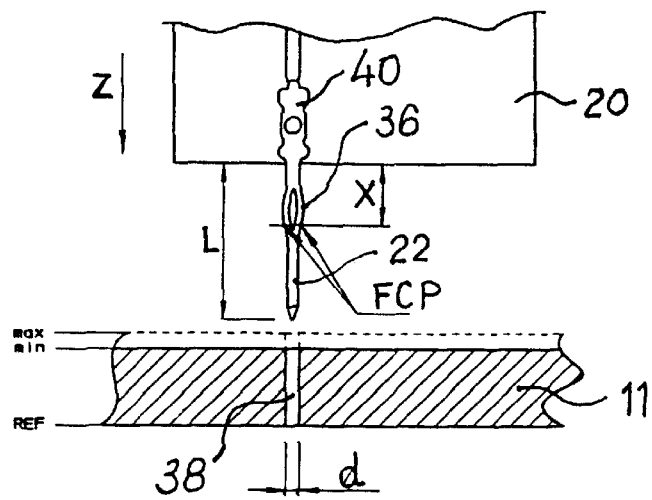
FIG. 2 is a detailed illustration of a contact pin with an compliant attachment zone, a connector housing and a printed circuit board.

FIG. 2 is a detailed view of a contact pin 22 equipped with an compliant attachment zone 36 that is located between a free guide end portion and an upper end portion 40 fixed in a connector housing 20.

The pin 22, with its attachment zone 36, must be inserted into a corresponding hole 38 of a printed circuit board 11 in order to achieve an electrical connection between the contact pin 22 and tin-coated internal surface of the hole 38.

Figure 3:
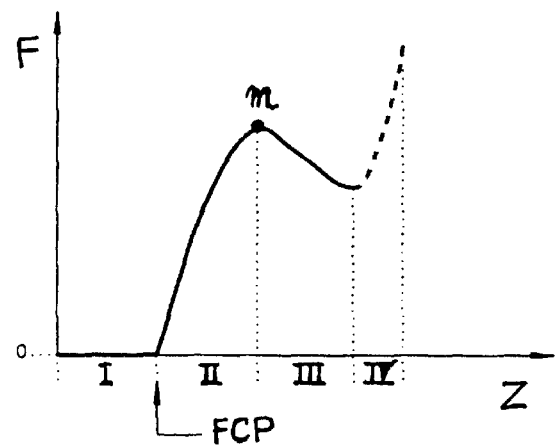
FIG. 3 shows the force/displacement diagram compiled during the insertion.

As illustrated in FIG. 3, the progress of the insertion cycle can be accurately monitored.

When displacing the insertion head 18 along the Z-axis, the force measured in the first zone "I" will virtually not increase. Moreover, during this displacement, the free end portion of the contact pin 22 will normally enter the hole 38 whereby virtually no force will be developed until the "first contact point" (FCP) is attained.

This first contact point is attained when the underside of the compliant attachment zone 36 comes into contact with the upper edge of the corresponding hole 38 of the circuit board 11.

At that moment, the force suddenly increases and we enter zone "II" on the Z-axis of the force/displacement diagram until a maximum force "m" is reached, whereby the thickest part of the compliant attachment zone of the contact pin is inserted into the hole in the board.

In zone "III", the pin is inserted further into the hole, and the insertion force is decreased slightly due to the fact that the maximum deformation force of the compliant attachment zone has been overcome, and material (tin/lead) is scraped away from the lining of the hole.

If the connector housing 20 were to be pressed further after it comes into contact with the surface of the circuit board 11, the diagram would extend further into a zone "IV", whereby the force would quickly increase substantially since the connector housing 20 and the circuit board 11 would be jammed between the insertion head 18 (upper device) and an anvil (lower device), which is normally provided to support the circuit board 1I during the insertion of the contact pins 22.

As already stated in the preamble, the thickness of the circuit board 11 is difficult to control (variable) as a minimum and a maximum value in relation to the reference plane (see FIG. 2).

In order to prevent over-pressing, it is desirable to stop before or upon entering zone "IV" of the displacement axis.

In many applications, it is also desirable to have an air gap of a known value between the connector housing 20 and the surface of the circuit board 11.

According to the invention, the force-displacement feedback provides a solution for this problem.

When the contact pin 22 penetrates the hole 38, no force will normally be generated. If a force is detected, this indicates that one or more contact pins are not correctly aligned.

In this event, the control computer can immediately stop the motor M in order to prevent an incorrect insertion cycle.

By means of force measurement in the insertion head 16, the control computer knows at which point on the Z-axis (insertion movement), the compliant attachment zone of the contact pins will come into contact with the surface of the circuit board 11.

Since the dimension X, namely the distance between the underside of the connector housing 20 and the first contact point (FIG. 2) for a hole diameter d that is also known, is a known value for each connector, the computer unit 26 can calculate the distance (insertion depth) to be travelled by the insertion head 18 before it comes into contact with the connector housing 20 of the circuit board 11.

As the insertion depth at which the insertion head 18 of the press device 10 must stop is decided during the start of the insertion cycle, over-pressing is impossible, and a specific air gap can be set between the underside of the connector housing 20 and the surface of the circuit board 11.

Since the first contact point for the same type of connector depends on the hole diameter d, this fact must be taken into account when determining the hole diameter by measurement with the aid of a CCD camera. For less accurate applications, measurement of the hole diameter with the aid of a CCD camera is not necessary.

The correct location for the first contact point is determined by:
- the geometry of the compliant attachment zone of the contact pin 22;
- the thickness of the printed circuit board 11;
- the diameter of the corresponding hole 38 in the board.

All of these parameters are programmed in the control computer beforehand, and the stopping of the displacement of the insertion depth of the insertion head 18 along the Z-axis will only be matched with the location where, according to the force-displacement curve, the first contact occurs between the pin and the hole.

We claim:

1. A method for inserting a contact pin with a compliant attachment zone into a hole in a printed circuit board by means of a pressing device provided with means for measuring an insertion force and means for measuring and controlling an insertion distance comprising steps of:
   before an insertion cycle begins, data concerning dimensions of the contact pin, geometry of the compliant attachment zone, a diameter of the hole in the printed circuit board, and a desired predetermined insertion depth are stored in the means for measuring and controlling;
   inserting a first section of the contact pin into the hole to guide the compliant attachment zone towards the hole and continually controlling the insertion force and the insertion distance during the step of inserting the first section into the hole;

upon the compliant attachment zone of the contact pin contacting the printed circuit board at the hole and a rise in insertion force being measured by the means for measuring insertion force, determining a distance for the contact pin to be further inserted into the hole; and continuing insertion of the contact pin into the hole, taking into account the determined distance, to insert the contact pin to the desired predetermined depth in the printed circuit board.

2. A method for inserting at least one contact pin having a compliant attachment zone into at least one hole in a printed circuit board, wherein one end of each contact pin is already attached to a connector housing and another end of each contact pin, which has the compliant attachment zone, projects from the connector housing with insertion being accomplished by a press device provided with means to measure an insertion force and means to measure and control an insertion distance, the method comprising steps of:

storing data in the press device of dimensions of the contact pins with respect to the connector housing, geometry of the compliant attachment zone, diameter of the at least one hole in the printed circuit board, and a desired insertion depth;

inserting a first non-compliant section of the at least one contact pin into the at least one hole to guide the compliant attachment zone of each pin towards the at least one hole and continually controlling the insertion force and the insertion distance during the step of inserting the first section of each pin into the at least one hole;

upon the compliant attachment zone of the at least one pin contacting the printed circuit board and a rise in measured insertion force by the means for measuring insertion force, determining a distance for the at least one contact pin to be further inserted into the at least one hole; and continuing insertion of the at least one contact pin into the at least one hole, taking into account the determined distance, to insert the at least one contact pin to a correct depth in the printed circuit board so that the connector housing comes to rest at a position between being against the printed circuit board and being a maximum predetermined distance from the printed circuit board.

* * * * *